United States Patent
Poulsen et al.

(10) Patent No.: US 7,750,731 B2
(45) Date of Patent: Jul. 6, 2010

(54) PWM LOOP FILTER WITH MINIMUM ALIASING ERROR

(75) Inventors: Soeren Poulsen, Lyngby (DK); Lars Risbo, Hvalsoe (DK)

(73) Assignee: Texas Instruments Incorporated, Dallas, TX (US)

(*) Notice: Subject to any disclaimer, the term of this patent is extended or adjusted under 35 U.S.C. 154(b) by 13 days.

(21) Appl. No.: 12/128,193

(22) Filed: May 28, 2008

(65) Prior Publication Data

US 2008/0297244 A1 Dec. 4, 2008

(30) Foreign Application Priority Data

May 29, 2007 (GB) .................. 0710186.8

(51) Int. Cl.
*H03F 3/38* (2006.01)

(52) U.S. Cl. .................. 330/10; 330/207 A
(58) Field of Classification Search .............. 330/10, 330/207 A, 251
See application file for complete search history.

(56) References Cited

U.S. PATENT DOCUMENTS

| | | | | |
|---|---|---|---|---|
| 5,604,466 A | * | 2/1997 | Dreps et al. | 331/113 R |
| 6,163,187 A | * | 12/2000 | Sano | 327/157 |
| 6,362,613 B1 | * | 3/2002 | Rodriguez | 323/315 |
| 7,091,759 B2 | * | 8/2006 | Sowlati et al. | 327/157 |
| 7,498,888 B2 | * | 3/2009 | Nitsche et al. | 331/17 |
| 2005/0017799 A1 | | 1/2005 | Risbo et al. | |
| 2007/0057721 A1 | | 3/2007 | Risbo et al. | |

OTHER PUBLICATIONS

Lars Risbo, Discrete-Time Modeling of Continuous-Time Pulse Width Modulator Loops, 27th Int. AES Conf., Denmark, Sep. 2005.
Lars Risbo, PWM Amplifier Control Loops With Minimum Aliasing Distortion, 120th AES Convention, France, May 20-23, 2006.

* cited by examiner

*Primary Examiner*—Henry K Choe
(74) *Attorney, Agent, or Firm*—John J. Patti; Wade J. Brady, III; Frederick J. Telecky, Jr.

(57) ABSTRACT

One embodiment of an apparatus for filtering an electrical signal includes a loop filter with an input and an output that applies a transfer function to a signal at the input. The transfer function has substantially no real part. The loop filter has a dominant pole placed substantially at or above an upper frequency in the frequency range of interest for the loop filter.

11 Claims, 7 Drawing Sheets

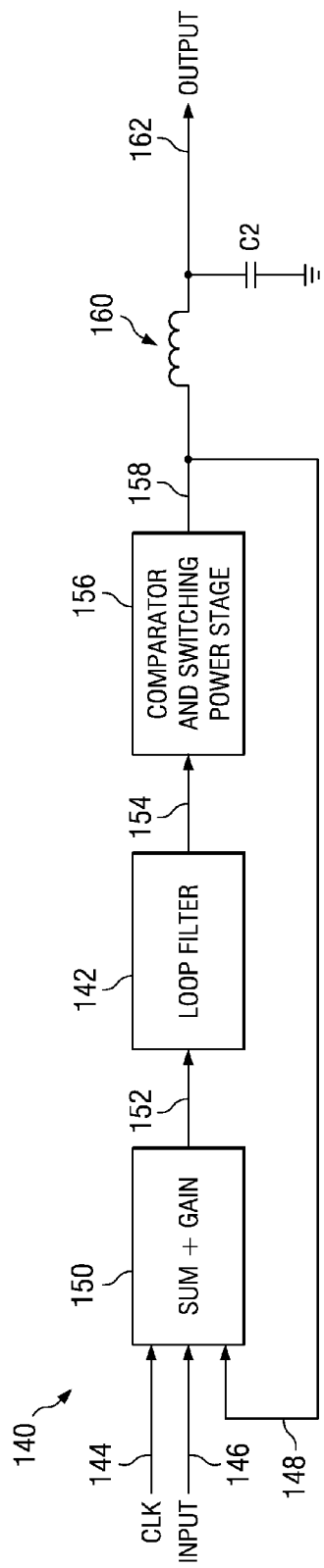
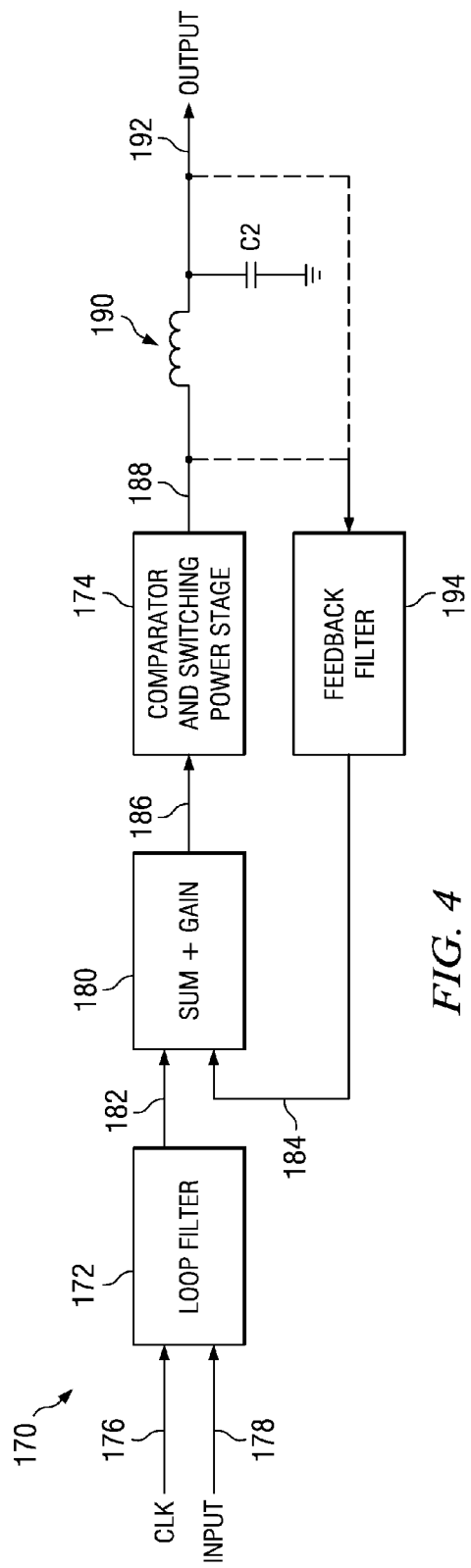

PWM LOOP FILTER WITH MINIMUM ALIASING ERROR

CROSS REFERENCE TO RELATED APPLICATION

The present application claims priority to (i.e., is a non-provisional of) GB Pat. App. No. 0710186.8 entitled "PWM Loop with Minimum Aliasing Error Property", and filed May 29, 2007 by Poulsen et al. The aforementioned application is assigned to an entity common hereto, and the entirety of the aforementioned application is incorporated herein by reference for all purposes.

BACKGROUND OF THE INVENTION

The present invention is related to signal amplification, and in particular to a loop filter for a PWM based amplifier with minimum aliasing error.

Various types of electronic amplifiers exist for amplifying an electrical signal using one or more output devices such as transistors. Electronic amplifiers are commonly grouped into several classifications based on how they fundamentally operate and how they conduct electricity over the different portions of the input cycle. Class A amplifiers have one or more output transistors that conduct in their linear range over the entire cycle or waveform of the input signal. The phase response of a class A amplifier is quite linear and produces a high quality output, but the class A amplifier is extremely inefficient. The output transistors in a class A amplifier may continue to conduct a DC current even if the input signal is off. Class B amplifiers have two complementary output transistors or sets of output transistors, each of which conducts in the linear range for half of the input cycle and is substantially off for the other half of the input cycle. A class B amplifier is much more efficient than a class A amplifier, but is susceptible to crossover distortion when switching from one output transistor to the other. Because it takes a small but significant amount of voltage for the output transistors to start conducting, portions of the input waveform that have a lower voltage than this turn-on voltage will not be reproduced faithfully by the class B amplifier. Class AB amplifiers combine some features of both class A and class B amplifiers in order to minimize or eliminate crossover distortion while sacrificing some efficiency. The output transistors in a class AB amplifier do not turn off during their inactive phase, but are biased so that they continue to conduct just enough to remain turned on during their inactive phase. While frequently used, all of these amplifier classes that operate in their linear ranges for all or some of the input cycle are relatively inefficient. For example, the theoretical limit on efficiency in these amplifier classes ranges from a maximum of about 78.5% or $\pi/4$ down to 25% or lower efficiencies.

As signal processing techniques have improved, class D amplifiers have seen increased use. The output transistors in class D amplifiers operate in switching mode, with the transistors either turned on or off in their most efficient states. The input signal is encoded or modulated in the switched signal produced by the output transistors. In one modulation technique, the input signal is pulse-width modulated by the class D amplifier. The output signal produced by the class D amplifier has a constant amplitude and frequency, but the width of each pulse is varied based on the strength of the input signal. The switching rate establishes a sampling frequency that is typically many times greater than the frequency of the input signal in order to capture the significant information. The output signal may be recovered or demodulated by passing it through a lowpass filter that effectively averages the PWM signal out. Considered at the switching frequency of the class D amplifier, the output of the lowpass filter appears to be a DC signal having an amplitude that is proportional to the duty cycle of the PWM output. Considered at lower frequencies, the output signal may appear as an analog signal having a widely varying amplitude, such as with the case of an audio signal. The class D amplifier is an attractive option because it is much more efficient than other amplifiers such as class A, class B or class AB amplifiers. The theoretical maximum efficiency of a class D amplifier is 100%, with actual efficiencies of over 90% depending on the application. Class D amplifiers are therefore used in a wide range of applications, such as audio amplifiers, motor control systems and other power conversion systems. This efficiency also results in lower cooling requirements, reducing the size and cost of cooling fins and housings for the amplifiers.

Many class D amplifier designs, however, suffer from distortion that limits their use in applications that require a high quality output such as high end audio amplifiers. A typical class D amplifier includes a feedback loop that introduces high frequency residuals into the signal at the PWM switching frequency. Distortion therefore remains a problem for class D amplifiers limiting their application in applications requiring a high quality output.

Hence, for at least the aforementioned reasons, there exists a need in the art for a loop filter for a PWM based amplifier that minimizes distortion from the high frequency modulation.

BRIEF SUMMARY OF THE INVENTION

The present invention is related to signal amplification, and in particular to a loop filter for a PWM based amplifier with minimum aliasing error.

Some embodiments of the present invention provide apparatuses for filtering an electrical signal. One embodiment of an apparatus for filtering an electrical signal includes a loop filter with an input and an output that applies a transfer function to a signal at the input. The transfer function has substantially no real part. The loop filter has a dominant pole placed substantially at or above an upper frequency in the frequency range of interest for the loop filter.

Other embodiments of the present invention provide amplifier circuits. One particular embodiment of an amplifier circuit includes an adder operable to combine an input signal and a feedback signal, a loop filter, a comparator operable to compare an input with a reference voltage, and a switching power stage. The loop filter has a phase response of substantially $-90$ degrees$-N*180$ degrees, where N is an integer value. The loop filter has a dominant pole placed substantially at or above an upper frequency in a range of input frequencies processed by the amplifier circuit. The adder, the loop filter, the comparator and the switching power stage are connected between an input and an output of the amplifier circuit.

Yet other embodiments of the present invention provide audio devices. One particular embodiment of an audio device according to the present invention includes an audio source and a PWM based audio amplifier connected to an output of the audio source. The PWM based audio amplifier includes a loop filter having a transfer function in which a real part of the transfer function is minimized at and above a switching frequency of the PWM based audio amplifier. The loop filter has a dominant pole placed substantially at or above an upper frequency in a range of input frequencies processed by the amplifier circuit. The PWM based audio amplifier also includes a comparator operable to compare an input with a reference voltage and a switching power stage. The loop filter, the comparator and the switching power stage are connected between an input and an output of the PWM based audio amplifier circuit.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 3 is a schematic diagram of an exemplary PWM based amplifier with a loop filter with minimum aliasing error that may employ the voltage or current output passive loop filters of FIG. 1A, 1B, 2A or 2B;

FIG. 4 is a schematic diagram of an exemplary PWM based amplifier with a loop filter with minimum aliasing error that may employ the current output passive loop filters of FIG. 2A or 2B;

DETAILED DESCRIPTION OF THE INVENTION

Figure 1A:
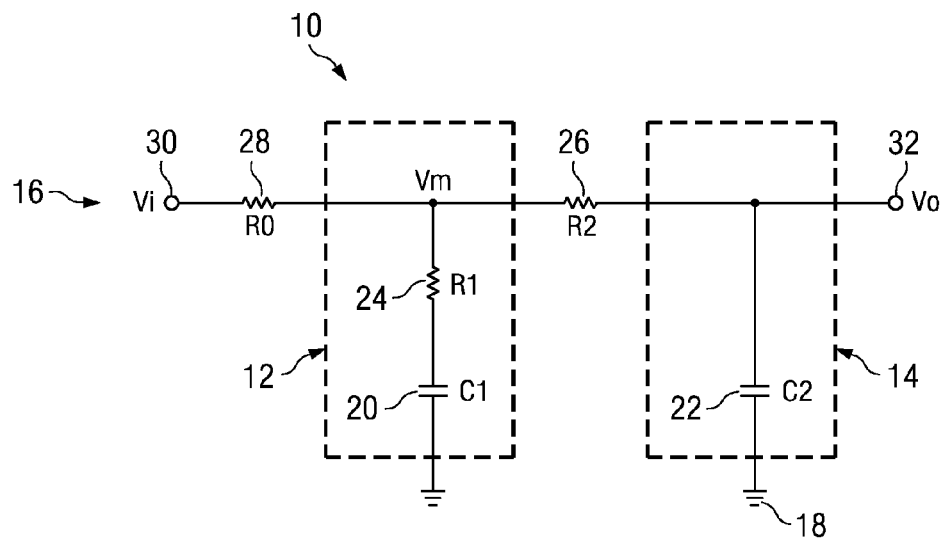
FIGS. 1A and 1B are schematic diagrams of passive loop filters with two poles and one zero and a voltage output according to two particular embodiments of the invention.

The present invention is related to signal amplification, and in particular to a loop filter for a PWM based amplifier with minimum aliasing error. The loop filter described herein may be used in a wide range of applications, such as in a PWM based class D audio power amplifier, or in an amplifier for motor control or power conversion systems, etc. Various embodiments of a PWM based amplifier with minimum aliasing error will be described herein. Generally, however, a PWM based amplifier contains a comparator that drives a switching power stage to produce an amplified PWM signal having a constant frequency and amplitude, in which the input signal is encoded in the duty cycle of the PWM signal. The comparator input is the audio input signal superimposed with a periodic carrier waveform with a frequency far above the frequency range of interest in the input signal. For example, in an audio amplifier, the frequency of the carrier waveform is far above the audible range (e.g. 200-800 kHz). This causes the switching power stage to produce the PWM output signal consisting of the amplified audio signal.

However, despite lowpass filtering such as with an LC filter between the switching power stage and the load, some undesirable high frequency carrier-related ripple will remain in the signal. In order to reduce noise and distortion, the basic modulator (i.e., open-loop comparator and switching power stage) may be embedded in a feedback loop by inserting a continuous-time loop filter network providing a high loop gain in the audio-band in which high error suppression is desired.

Even with the feedback loop and filtering, some undesirable high frequency carrier-related ripple will remain in the signal. The minimum aliasing error (MAE) technique employed by the loop filters disclosed herein shapes the feedback signal so that the impact of the high frequency ripple on the linearity of the modulation is minimal. Thus rather than attempting to filter all of the high frequency ripple out, the phase response of the loop filter is tailored to minimize aliasing errors and shape the ripple in the loop filter signal as close as possible to the ideal triangular waveform. (The rising and falling slopes of the triangular waveform, in other words the rise and fall time, vary based on the duty cycle.) The closer the ripple is to the ideal waveform, the lower the total harmonic distortion (THD) in the PWM modulator. As will be described in more detail below, the loop filters of the present invention achieve MAE by minimizing or eliminating the real part of the complex transfer function at the switching frequency and beyond by clamping the loop filter's phase response to $-90$ deg$-n*180$ deg with n being an integer value. Both passive and active loop filters with MAE will be described, although it is particularly difficult to achieve the MAE property with an active filter due to the limited open loop gain at high frequencies of opamps. This limited open loop gain makes it difficult to control the phase response of an active loop filter to obtain a transfer with no real part. However, as will be described, by careful placement of poles and zeros and a mixture of active and passive poles and zeros, a loop filter that is at least partially active having an MAE property may be achieved.

The loop filter in a PWM based amplifier is the transfer function of the combined circuitry from feedback node(s) to comparator input, that is the feedback path(s) and the forward path of the feedback loop. When closing the loop with negative feedback the loop filter acts to suppress errors on the feedback node(s) as well as to control the small signal transfer function from amplifier input to output, or frequency response.

The PWM based amplifiers may have an LC output filter for demodulation of the PWM output signal from the switching power stage. The feedback node to the loop filter can be either before or after the LC filter, or can be a combination of the two. The LC filter has a transfer characteristic highly dependant on the load, e.g., a speaker, connected to the output of the amplifier. The LC filter also has a frequency dependant output impedance, and it introduces distortion, primarily from the inductor core, making inclusion of the LC filter within the feedback loop desirable. However, including the LC filter in the feedback loop involves a load dependant loop function which is addressed in the design of the loop filter.

Turning now to FIGS. 1 and 2, various embodiments of a passive loop filter with minimum aliasing error will be described. The passive loop filters of these particular embodiments each include two poles and one zero. Referring to FIG. 1A, one particular embodiment of a passive loop filter 10 with MAE has a voltage output and includes two legs 12 and 14 connected in parallel between a main signal path 16 and ground 18. Each of the two legs 12 and 14 include a capacitor 20 and 22, respectively, with the first leg 12 also including a resistor 24 connected in series with the capacitor 20. A resistor 26 is connected in the main signal path 16 between the two legs 12 and 14, and an input resistor 28 is connected between the input 30 of the passive loop filter 10 and the first leg 12. As will be described below, the input resistor 28 may consist of the parallel combination of three resistors in an adder of a PWM amplifier. The output 32 of the passive loop filter 10 is a voltage output and is intended to be used with a high impedance input of a comparator. The selection of values for the resistors and capacitors to obtain the desired placement of poles and zeros in the passive loop filter 10 of FIG. 1A will be described below.

Figure 1B:
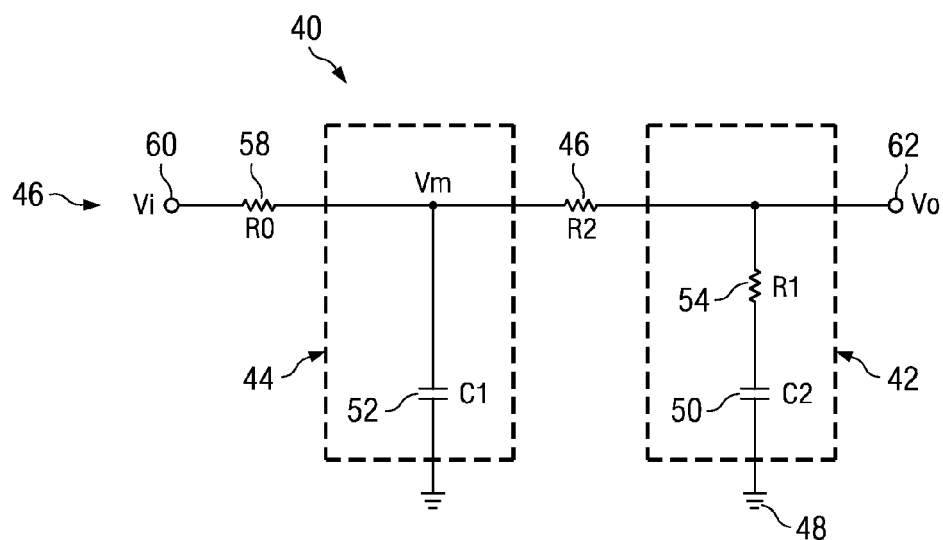

Turning now to FIG. 1B, another particular embodiment of a passive loop filter 40 with MAE is illustrated in which the two legs 42 and 44 are swapped with respect to the passive loop filter 10 of FIG. 1A. The same transfer function may be achieved in the passive loop filters 10 and 40, although the component values will be different as will be described below. The two legs 42 and 44 are connected in parallel between a main signal path 46 and ground 48. Each of the two legs 42 and 44 include a capacitor 50 and 52, respectively, with the second leg 42 also including a resistor 54 connected in series with the capacitor 50. A resistor 56 is connected in the main signal path 46 between the two legs 42 and 44, and an input resistor 58 is connected between the input 60 of the passive loop filter 40 and the first leg 44. Again, the input resistor 58 may consist of the parallel combination of three resistors in an adder of a PWM amplifier. The output 62 of the passive loop filter 40 at the top of the second leg 42 is a voltage output and is intended to be used with a high impedance input of a comparator.

Figure 2A:
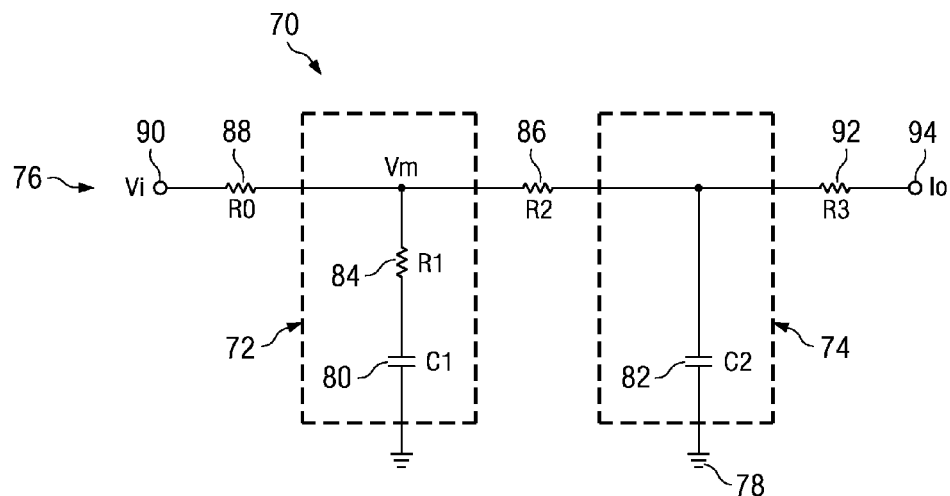
FIGS. 2A and 2B are schematic diagrams of passive loop filters with two poles and one zero and a current output according to two particular embodiments of the invention.

Turning now to FIG. 2A, a current output passive loop filter 70 with MAE is illustrated in which two legs 72 and 74 are connected in parallel between a main signal path 76 and ground 78. Each of the two legs 72 and 74 include a capacitor 80 and 82, respectively, with the first leg 72 also including a resistor 84 connected in series with the capacitor 80. A resistor 86 is connected in the main signal path 76 between the two legs 72 and 74, and an input resistor 88 is connected between the input 90 of the passive loop filter 70 and the first leg 72. Again, the input resistor 58 may consist of the parallel combination of three resistors in an adder of a PWM amplifier. An output resistor 92 is connected between the second leg 74 and the output 94. The output 94 of the passive loop filter 70 is a current output and is intended to be used with a low impedance input of a comparator (or opamp) which appears as a virtual ground to the passive loop filter 70.

Figure 2B:
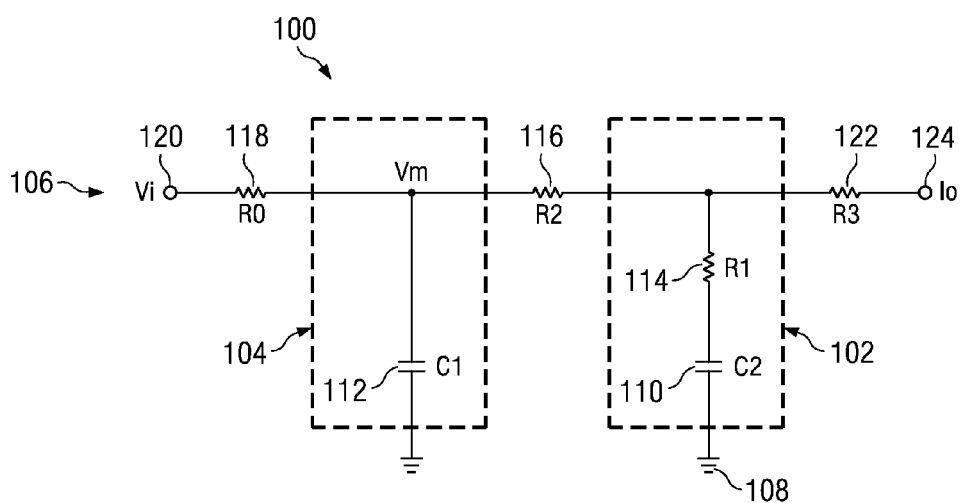

Turning now to FIG. 2B, another particular embodiment of a current output passive loop filter 100 with MAE is illustrated in which the two legs 102 and 104 are swapped with respect to the passive loop filter 70 of FIG. 2A. The same transfer function may be achieved in the passive loop filters 70 and 100, although the component values will be different as will be described below. The two legs 102 and 104 are connected in parallel between a main signal path 106 and ground 108. Each of the two legs 102 and 104 include a capacitor 110 and 112, respectively, with the first leg 102 also including a resistor 114 connected in series with the capacitor 110. A resistor 116 is connected in the main signal path 106 between the two legs 102 and 104, and an input resistor 118 is connected between the input 120 of the passive loop filter 100 and the first leg 104. Again, the input resistor 118 may consist of the parallel combination of three resistors in an adder of a PWM amplifier. An output resistor 122 is connected between the second leg 102 and the output 124. The output 124 of the passive loop filter 100 is a current output and is intended to be used with a low impedance input of a comparator which appears as a virtual ground to the passive loop filter 100.

Turning now to FIG. 3, one particular embodiment of a class D PWM-based amplifier 140 that may include a passive loop filter 142 will be described. In this embodiment, the passive loop filter 142 may be either a voltage or current output loop filter such as those illustrated in FIG. 1A, 1B, 2A or 2B. A clock input 144, signal input 146 and feedback signal 148 are combined in a sum+gain block or adder 150. The clock input 144 establishes the modulation frequency of the PWM based amplifier 140, and the signal input 146 provides the signal to be amplified by the PWM based amplifier 140. For example, the signal input 146 may be an audio input to be amplified, a motor control signal, etc. Note that the signal input 146 in this and other embodiments described herein may be an analog signal or another type of input signal such as a PWM input signal to be amplified and demodulated. The output 152 of the adder 150 is connected to the passive loop filter 142, which filters the output 152 of the adder 150 to produce a carrier signal that approaches the ideal triangle wave on the output 154 of the passive loop filter 142. The carrier signal on the output 154 of the passive loop filter 142 is connected to a comparator and switching power stage 156 which converts the triangle carrier signal from the passive loop filter 142 into an amplified PWM signal with a duty cycle proportional to the amplitude of the input signal 146. The PWM signal on the output 158 of the comparator and switching power stage 156 may be fed into an LC filter 160 to demodulate the PWM signal before it reaches the output 162 for use by a speaker or other load. In effect, the LC filter 160 averages the voltage of the PWM signal over the on and off time of each cycle to generate what can be considered a DC voltage considered at the modulation or switching frequency of the PWM based amplifier 140. In this particular embodiment, the feedback signal 148 is taken from the output 158 of the comparator and switching power stage 156. Again, the PWM based amplifier 140 illustrated in FIG. 3 may be used with either voltage or current output loop filters as illustrated in FIG. 1A, 1B, 2A or 2B.

Turning now to FIG. 4, another embodiment of a PWM based amplifier 170 having a current output passive loop filter 172 will be described. This PWM based amplifier 170 uses a current output passive loop filter 172 such as those illustrated in FIGS. 2A and 2B. The input of a comparator and switching power stage 174 is thus a low impedance virtual ground, isolating the forward path and feedback network so their impedances will not affect each other. A clock input 176 and signal input 178 are combined in the passive loop filter 172, for example by simply connecting them together at the input 90 or 120 of the input resistor 88 or 118 in the passive loop filter 172. A sum+gain block or adder 180 combines the output 182 of the passive loop filter 172 with a feedback signal 184, forming a carrier signal on the output 186 of the adder 180. The carrier signal is provided to the comparator and switching power stage 174, generating a PWM signal on the output 188 of the comparator and switching power stage 174. The PWM signal may be filtered by an LC filter 190 before reaching the output 192 of the PWM based amplifier 170. Feedback may be taken from either or both of the output 188 of the comparator and switching power stage 174 or the output 192 of the LC filter 190. A feedback filter 194 may be included in the feedback path to perform feedback frequency compensation to achieve the desired overall phase response for MAE in the PWM based amplifier 170.

If the feedback is taken from the output 188 of the comparator and switching power stage 174 alone, the feedback filter 194 has the same topology as the passive loop filter 172, such as the passive loop filter 70 or 100 of FIGS. 2A and 2B. If the feedback is taken from the output 192 of the LC filter 190, the feedback filter 194 has the topology illustrated in FIG. 5. The different feedback filter 194 topology compensates for the fact that the LC filter 190 adds a double pole to the system, so instead of having a filter in the feedback path consisting of two poles and a zero, the feedback filter is changed to a topology with two zeros and a pole. If the feedback is taken from both the output 188 of the comparator and switching power stage 174 and the output 192 of the LC filter 190, both feedback paths and filters described above are provided. The feedback taken from the output 188 of the comparator and switching power stage 174 alone will pass through a feedback filter 194 having the same topology as the passive loop filter 172, such as the passive loop filter 70 or 100 of FIGS. 2A and 2B. The feedback taken from the output 192 of the LC filter 190 will follow a parallel path through a feedback filter 194 having the topology illustrated in FIG. 5. The outputs of the two parallel feedback filter 194 will be summed in the adder 180 with the output 182 of the passive loop filter 172. Because the adder 180 is a current summing node as will be described in more detail below with respect to FIG. 6B, it is a virtual ground, allowing multiple feedback feeds to be connected in parallel.

Figure 5:
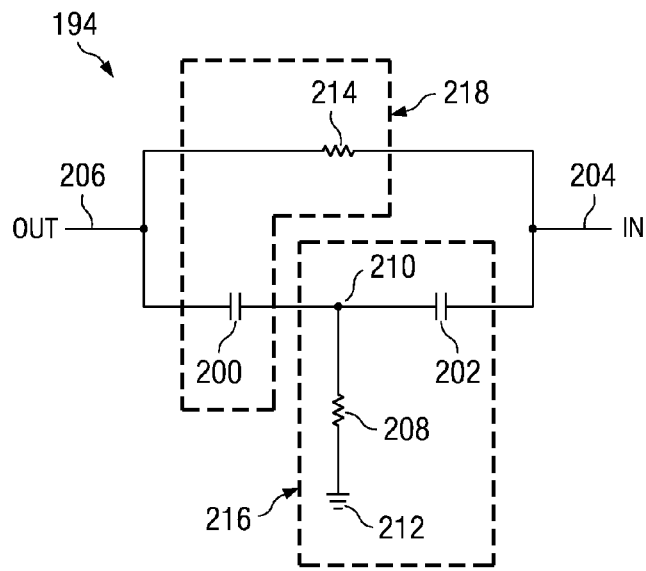
FIG. 5 is a schematic diagram of a feedback filter that may be used with the PWM based amplifier of FIG. 4.

Turning now to FIG. 5, a schematic diagram of one particular embodiment of the feedback filter 194 used in a PWM based amplifier 170 with a current output passive loop filter 172 as in FIG. 4 will be described. The feedback filter 194 includes a 'T' formed by a pair of series capacitors 200 and 202 connected between an input 204 and output 206, with a resistor 208 connected at one end to the node 210 between the capacitors 200 and 202 and at the other end to ground 212. Another resistor 214 is connected between the input 204 and output 206 in parallel with the pair of series capacitors 200 and 202. The capacitor 202 nearest the input 204 and the resistor 208 to ground 212 form a highpass filter 216 with a pole located at C 202*R 208. The capacitor 200 nearest the output 206 and the parallel resistor 214 also form a combination 218 with a pole equal to the pole of highpass filter 216. To ensure this placement of poles, the normalized values of the resistors and capacitors in the feedback filter 194 are as follows: R 214=R, C 200=C 202=2C, and R 208=R/4, where R and C form the pole at C 202*R 208.

Figure 6A:
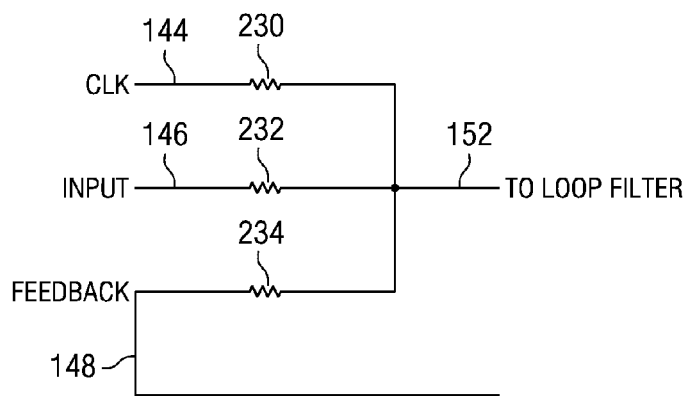
FIG. 6A is a schematic diagram of the contents of the sum/gain block of FIG. 3 in one particular embodiment of the invention.

Turning now to FIG. 6A, a schematic diagram of the contents of the adder 150 of FIG. 3 will be described. The clock input 144 is connected to a resistor 230, the signal input 146 is connected to a resistor 232 and the feedback signal 148 is connected to a resistor 234, with the resistors 230, 232 and 234 connected in parallel to the output 152 of the adder 150. Note that the resistors 230, 232 and 234 in parallel form the input resistor (e.g., 28, 58, 88 or 118) of the loop filter (e.g., 10, 40, 70 or 100).

Figure 6B:
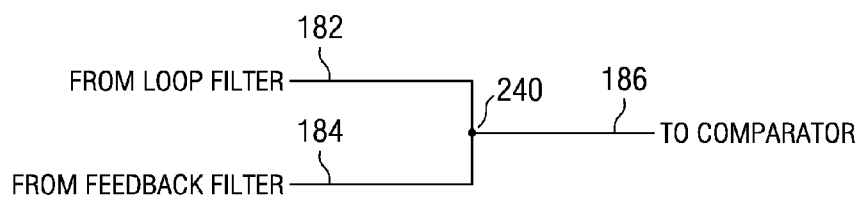
FIG. 6B is a schematic diagram of the contents of the sum/gain block of FIG. 4 in one particular embodiment of the invention.

Turning now to FIG. 6B, a schematic diagram of the contents of the adder 180 of FIG. 4 will be described. In the PWM based amplifier 170 of FIG. 4, the passive loop filter 172 is a current output only, so the adder 180 has a low impedance input node or a virtual ground. The adder 180 of FIG. 4 may thus comprise a common node 240 to which the output 182 of the passive loop filter 172, the feedback signal 184 and the output 186 of the adder 180 are all connected.

Figure 7:
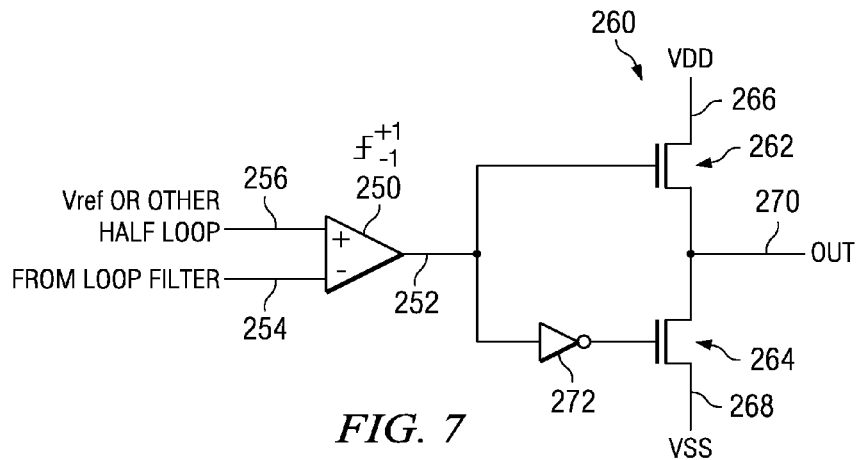
FIG. 7 is a schematic diagram of the comparator/switching power stage of FIGS. 3 and 4 in one particular embodiment of the invention.

Turning now to FIG. 7, a schematic diagram of the comparator and switching power stage 156 and 174 of FIGS. 3 and 4 in one particular embodiment of the invention will be described. A comparator 250 is used to generate a PWM signal on the output 252 of the comparator 250 by comparing an input signal 254 on the inverting input of the comparator 250 with a reference signal 256 on the non-inverting input of the comparator 250. The input signal 254 is a triangle carrier as generated by the passive loop filter 142 of FIG. 3, consisting of a filtered combination of the clock input 144, the signal input 146 and the feedback signal 148. In another embodiment, the output 154 is a triangle carrier from the output 186 of the adder 180 of FIG. 4, also consisting of a filtered combination of the clock input 176, the signal input 178 and the feedback signal 184. The reference signal 256 may comprise a constant reference voltage such as a ground if the PWM based amplifier 140 or 170 uses a single ended switching power stage 260 that switches between VDD and ground. In another particular embodiment, the PWM based amplifier 140 or 170 may use a double ended switching power stage in which two instances of the comparator and switching power stage 156 or 174 are included, one switching between VDD and ground and the other switching between ground and VSS, for a combined rail to rail output that swings from VDD to VSS. In this embodiment, the reference signal 256 supplied to the non-inverting input of the comparator 250 in each instance of the comparator and switching power stage 156 or 174 is taken from the output of the other instance of the comparator and switching power stage 156 or 174. The switching power stage 260 in the comparator and switching power stage 156 or 174 includes a totem pole of switches or transistors 262 and 264 between VDD 266 and VSS 268 or ground. The gates of the transistors 262 and 264 are controlled by the output 252 of the comparator 250. The totem pole of transistors 262 and 264 drive the output 270 between VDD 266 and VSS 268 or ground under the control of the comparator 250, forming the output 158 or 188 of the comparator and switching power stage 156 or 174. The switching power stage 260 may comprise MOSFETS or any other suitable switch or transistor. In one particular embodiment, the transistors 262 and 264 are n-channel MOSFETS, with an inverter 272 connected to the gate of one of the transistors (e.g., 264).

Note that the PWM amplifier described herein may use a square wave clock signal that is combined with the input and feedback signals as described herein, or may in another particular embodiment use a triangular carrier signal. If a triangular carrier is used, it may either be summed with the output from the loop filter in an adder (not shown) between the loop filter and comparator, or it may be provided to the comparator input not receiving the loop filter output, for example, as the reference signal 256 provided to the non-inverting input of the comparator 250 of FIG. 7. In these particular embodiments using a triangular carrier, the clock signal may be omitted.

The invention uses a very simple method of achieving MAE properties in the loop filters, and includes configuring the loop filter such that the transfer function of the loop filter has two poles and a single zero:

$$H(\omega) = \frac{i\omega - z}{(i\omega - p_1)(i\omega - p_2)}$$

Multiplying the numerator and the denominator with the complex conjugate of the denominator, the MAE property requirements are easily found:

$$H(\omega) = \frac{i\omega - z}{(p_1 p_2 - \omega^2) - i\omega(p_1 + p_2)}$$

$$= \frac{(i\omega - z)[(p_1 p_2 - \omega^2) + i(p_1 + p_2)]}{(p_1 p_2 - \omega^2)^2 + \omega^2(p_1 + p_2)^2}$$

$$= -\frac{z \cdot p_1 \cdot p_2 - (z + p_1 + p_2)\omega^2 + i(\omega^3 + z(p_1 + p_2) - p_1 \cdot p_2)}{\omega^4 + (p_1^2 + p_2^2)\omega^2 + (p_1^2 \cdot p_2^2)}$$

Minimizing the real part of the numerator:

$\mathrm{Re}[H(\omega)] = \min$

⇕

$(-z + p_1 + p_2)\omega^2 = 0$ $z = p_1 + p_2$

Figure 8:
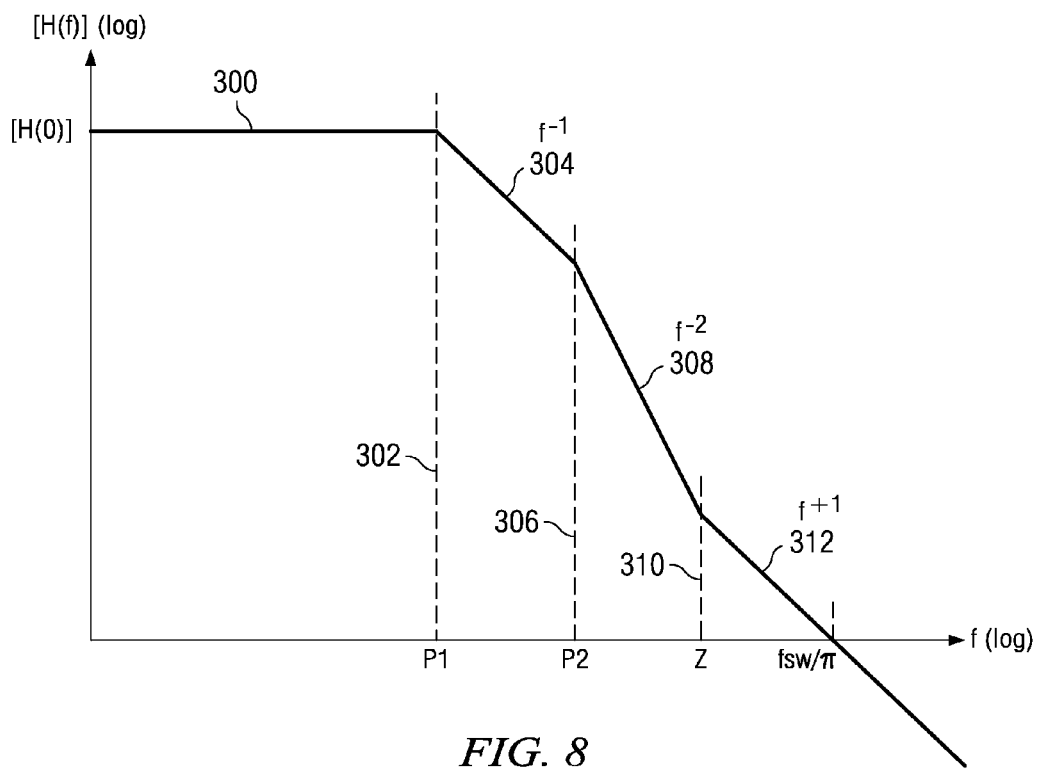
FIG. 8 is a plot of maximum loop gain for a PWM based amplifier with a loop filter designed for minimum aliasing error.

Obtaining the maximum open loop gain in the loop filter depends on the placement of system poles relative to the switching frequency. For a fixed frequency system using an external clock 144 or 176, general stability criteria calls for a maximum open loop bandwidth of $1/\pi$ of the switching frequency. A plot of maximum loop gain for a PWM based amplifier with a loop filter designed for minimum aliasing error in shown in FIG. 8. The plot of FIG. 8 shows a highly idealized response of the loop filter. The idealized response of the loop filter has a flat gain 300 up to the frequency of the first and dominant pole 302, followed by a first order rolloff 304 up to the frequency of the second pole 306. A second order rolloff 308 follows up to the frequency of the zero 310, followed again by a first order rolloff 312. The maximum low frequency open loop gain may be achieved by maximizing the middle term of the transfer function:

$$|H(0)| = 20\log\left(\frac{f_{P2}}{f_{P1}}\right) + 40\log\left(\frac{f_Z}{f_{P2}}\right) + 20\log\left(\frac{f_{SW}}{\pi f_Z}\right)$$

The middle term may be maximized by maximizing the spacing between the second pole 306 and the zero 310. Because the frequency of the zero 310 equals the frequency of the first pole 302 plus the frequency of the second pole 306 when designed for MAE, maximum loop gain is achieved when the first and second poles 302 and 306 are at the same frequency as a double pole. Identical values for the first and second poles 302 and 306 may be difficult to achieve by passive networks, but when designing with such passive networks placement of the poles are made as tight as possible. The low frequency gain in one particular embodiment with a lower pole frequency of 20 kHz and a switching frequency of 400 kHz is about 20 dB, with a theoretical maximum of 28 dB when the first and second poles 302 and 306 are at the same frequency as a double pole.

Figure 9:
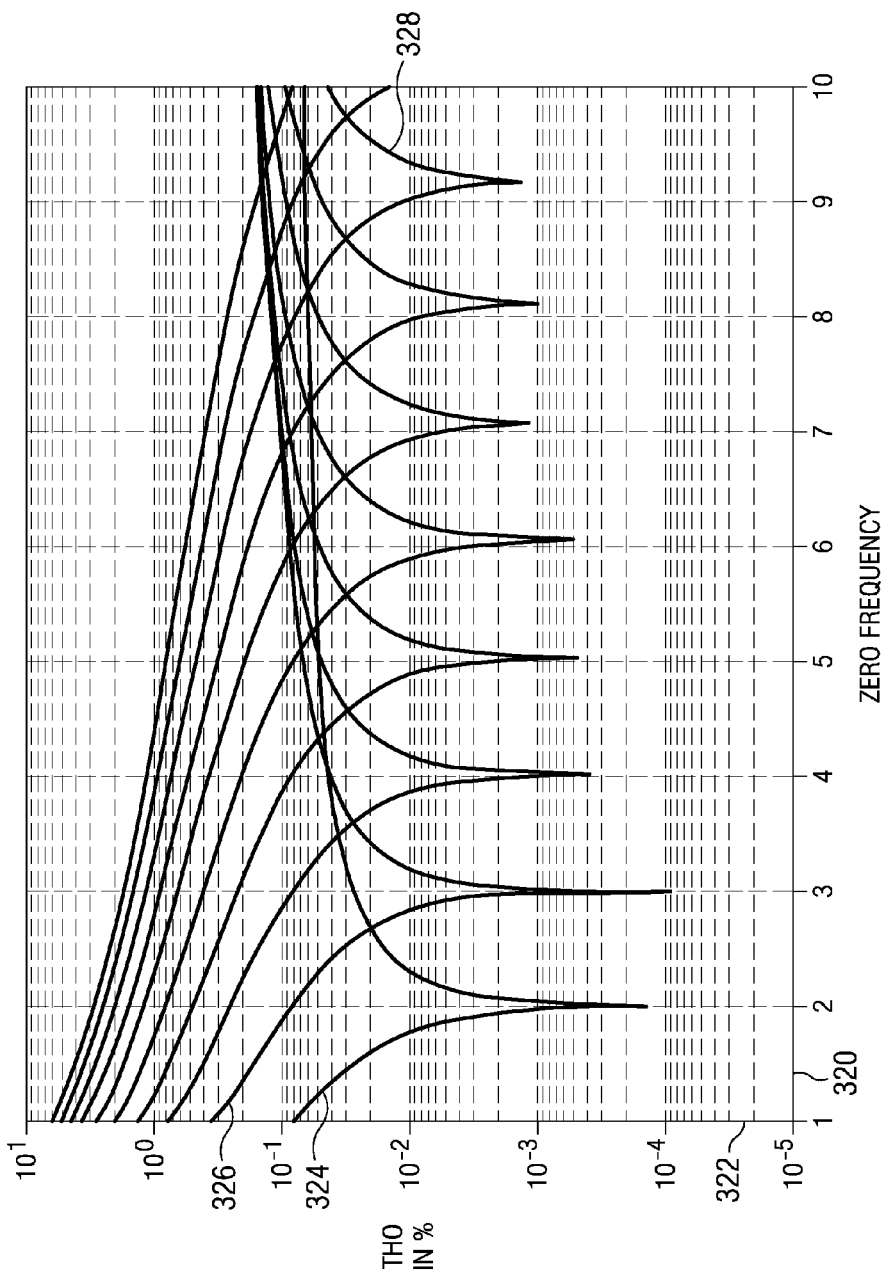
FIG. 9 is a plot of total harmonic distortion (THD) versus zero frequency with normalized pole and zero frequencies, for a first normalized pole frequency of 1 and second normalized pole frequency from 1 to 10.

Turning now to FIG. 9, the total harmonic distortion (THD) for various relative frequency values of the two poles and the zero are illustrated with normalized pole and zero frequencies. FIG. 9 shows a plot of THD in percentage versus zero frequency for a first normalized pole frequency of 1 showing minimums for second normalized pole frequencies ranging from 1 to 8. The zero frequency is plotted along the X axis 320 and THD is plotted on the Y axis 322. The best output signal is achieved when the THD is at a minimum. Thus, for the line 324 wherein the second pole is at 1, the minimum THD is achieved when the zero is at 2, fulfilling the z=p1+p2 with the values 2=1+1. For the line 326 wherein the second pole is at 2, the minimum THD is achieved when the zero is at 3, fulfilling the z=p1+p2 with the values 3=1+2. Note that in the plot of FIG. 9, the plot lines corresponding to the normalized values for the frequency of the second pole increase by 1 for each minimum THD from left to right. Thus, line 324 is at a normalized second pole frequency of 1, line 326 is at a normalized second pole frequency of 2, up to line 328 at a normalized second pole frequency of 8.

Turning back to FIG. 1A, the calculation of resistor and capacitor values for the voltage output passive loop filter 10 will be discussed. In one particular embodiment, the resistors, capacitors, poles and zero have the following normalized values:

$R0\ 28 = 1$ $R1\ 24 = 1$ $R2\ 26 = 2$ $C1\ 20 = 1$ $C2\ 22 = 1$ $\text{poles} = \begin{cases} 1.0000 \\ 2.6180 \end{cases}$ $\text{zero} = 3.6180$ For the passive loop filter 10 of FIG. 1A, relationships between the normalized values for the resistors, capacitors and zero frequencies are established by the following equations:

$$R1 = \frac{1}{\frac{1}{R\_CLK} + \frac{1}{R\_IN} + \frac{1}{R\_FB}}$$

$R2 = 2 \cdot R1$ $$C1 = \frac{1}{2 \cdot \pi \cdot f_Z \cdot R1}$$

$C2 = C1$

For an exemplary audio input, the input signal may have a frequency range interest from some lower frequency near 0 Hz to an upper frequency of 20 kHz. The frequency of the zero can be de-normalized by multiplying the normalized value of 3.6180 by the upper frequency of 20 kHz. The zero frequency would therefore be 72.36 kHz, the first pole frequency would be 20 kHz, and the second pole frequency would be 52.36 kHz. The resulting de-normalized values for one particular embodiment of the passive loop filter 10 of FIG. 1A are as follows:

R1 24=10 kΩ
R_CLK 230=26.1 kΩ
R_IN 232=16.7 kΩ
R_FB 234=540 kΩ
R2 26=20 kΩ
C1 20=220 pF
C2 22=220 pF

Note that the values given above for the resistors and capacitors of the passive loop filter 10 of FIG. 1A are purely exemplary and may be adapted as desired based on the performance requirements of the application.

In one particular embodiment of the voltage output passive loop filter 40 of FIG. 1B, the resistors, capacitors, poles and zero may have the following normalized values:

$$RO\ 58 = 1$$
$$R1\ 54 = 0.5616$$
$$R2\ 46 = 2$$
$$C1\ 52 = 1$$
$$C2\ 50 = 1$$
$$\text{poles} = \begin{cases} 1.0000 \\ 5.9562 \end{cases}$$
$$\text{zero} = 6.9562$$

In one particular embodiment of the current output passive loop filter 70 of FIG. 2A, the resistors, capacitors, poles and zero may have the following normalized values:

$$RO\ 88 = 1$$
$$R1\ 84 = 0.6930$$
$$R2\ 86 = 2$$
$$C1\ 80 = 1$$
$$C2\ 82 = 1$$
$$\text{poles} = \begin{cases} 1.0000 \\ 1.6352 \end{cases}$$
$$\text{zero} = 2.6352$$

In one particular embodiment of the current output passive loop filter 100 of FIG. 2B, the resistors, capacitors, poles and zero may have the following normalized values:

$$RO\ 118 = 1$$
$$R1\ 114 = 0.4254$$
$$R2\ 116 = 2$$
$$C1\ 112 = 1$$
$$C2\ 110 = 1$$
$$\text{poles} = \begin{cases} 1.0000 \\ 2.0347 \end{cases}$$
$$\text{zero} = 3.0347$$

Figure 10:
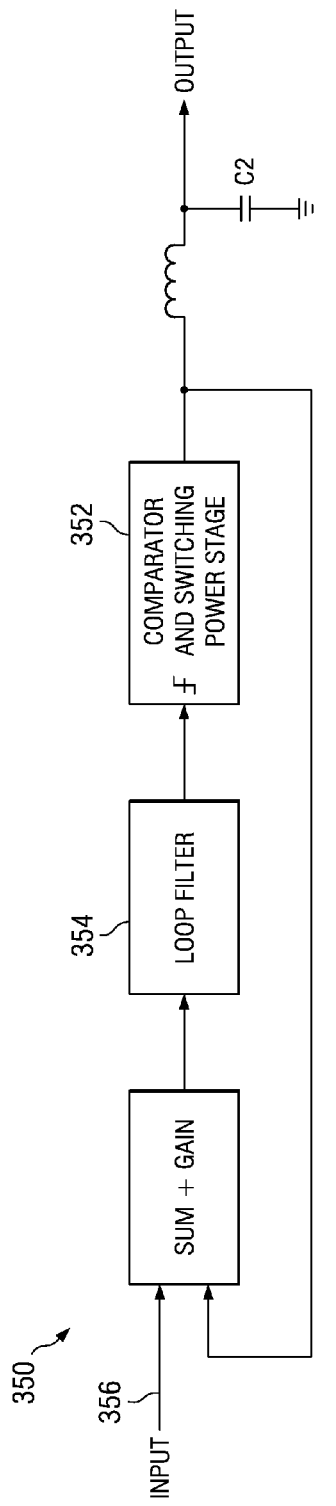
FIG. 10 is a schematic diagram of an exemplary amplifier with a loop filter with minimum aliasing error that may employ the voltage or current output passive loop filters of FIG. 1A, 1B, 2A or 2B in various particular embodiments of the invention, including a self-oscillating amplifier with an analog input and an amplifier with a PWM input.

Turning now to FIG. 10, several embodiments of a PWM based amplifier will be described. In the first of these embodiments, a self-oscillating PWM based amplifier 350 having a passive loop filter 352 will be described. This particular embodiment of the self-oscillating PWM based amplifier 350 generally has the same topology as the PWM based amplifier 140 of FIG. 3, although other topologies may be adapted as well to clockless self-oscillation. In the PWM based amplifiers 140 and 170 illustrated in FIGS. 3 and 4, the modulation frequency is determined by the frequency of the input clock 144 and 176. In the self-oscillating PWM based amplifier 350, the clock input is replaced by a hysteresis window at the input of the comparator and switching power stage 352 and/or by a time delay element (not shown) added anywhere in the self-oscillating PWM based amplifier 350, whether in the forward path or the feedback loop. The self-oscillating PWM based amplifier 350 will then switch as some frequency determined by the delay through the loop and the width of the hysteresis window compared to the magnitude of the ripple signal out of the loop filter 354. The output of the loop filter 354 is a triangle carrier signal as with previous embodiments. If there is no delay in the system, then the switching speed of the self-oscillating PWM based amplifier 350 may be determined by the relation between the magnitude of the output signal from the loop filter 354 and the width of the hysteresis window. A wider hysteresis window will reduce the switching frequency and vice versa. Adding a delay will also reduce the switching frequency.

The various embodiments of PWM based amplifiers described above have generally included an analog input such as an audio signal that is combined in the amplifier with a feedback signal and a clock signal, except for the self-oscillating embodiment which omits the clock signal. The PWM based amplifier may also have a PWM input signal rather than an audio signal. Thus, turning again to FIG. 10, the input signal 356 may either be an analog input as discussed in other embodiments or a PWM input signal as in this particular embodiment. The PWM input signal may replace both the analog input and clock input of various other embodiments described above, because the PWM input signal may contain both sets of information. For example, to adapt the embodiments of FIG. 3 or FIG. 4 to a PWM input signal, the analog inputs 146 and 178 may be tied off or removed, and the PWM input signal fed into the clock input 144 or 176.

Figure 11:
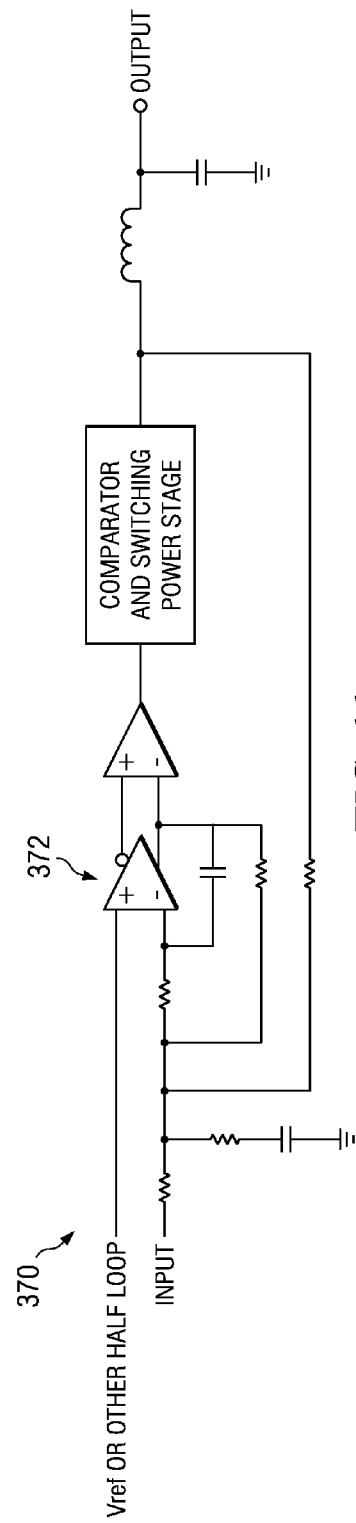
FIG. 11 is a schematic diagram of a PWM based amplifier with minimum aliasing error with active gain according to one particular embodiment of the invention where a first pole and zero are passive and a second pole is active.

Turning now to FIG. 11, another embodiment of a PWM based amplifier 370 may use an active loop filter 372. The PWM based amplifier 370 has two poles and a zero as with the other embodiments discussed herein, with the first and dominant pole placed near or above the upper frequency in the frequency range of interest. In contrast, the dominant pole of a typical integrator-based loop filter will have a much lower frequency. For example, for use in amplifying an audio signal, the first pole in the PWM based amplifier 370 may be placed near or above 20 kHz. In contrast to a typical integrator used in a loop filter, the low frequency loop gain of the active loop filter 372 is limited to some small gain such as about 20-30 dB loop gain at low frequencies, preventing problems due to clipping and unstable startup conditions. In combination with the limited low frequency loop gain and the shaping of the transfer function to comply with MAE properties gives a combination of high stability, reduced startup and clipping artifacts and a very linear modulation and thereby very high performance. In the particular embodiment of a PWM based amplifier 370 illustrated in FIG. 11, the zero and one pole is passive, and one pole is active. However, any combination of active and passive poles, zero and gain realizations may be used to achieve the MAE properties and limited low frequency loop gain with an active loop filter 372 to obtain these benefits. Therefore, the particular topology of the PWM based amplifier 370 of FIG. 11 is purely exemplary.

In conclusion, the present invention provides novel apparatuses for filtering a signal, for example in a class D PWM based amplifier, with minimum aliasing error, using both passive and active loop filters. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An audio amplifier comprising:
   a loop filter having a transfer function with a real part being minimized at and above a switching frequency of the audio amplifier, wherein the loop filter has a dominant pole placed substantially at or above an upper frequency in a range of input frequencies processed by the audio amplifier;
   an adder having:
      a first resistor that receives a clock signal and that is coupled to the loop filter;
      a second resistor that receives the input signal and that is coupled to the loop filter; and
      a third resistor that is receives the feedback signal and that is coupled to the loop filter; and
   an output stage that is coupled to the adder.

2. An audio amplifier comprising:
   a loop filter having a transfer function with a real part being minimized at and above a switching frequency of the audio amplifier, wherein the loop filter has a dominant pole placed substantially at or above an upper frequency in a range of input frequencies processed by the audio amplifier;
   an adder that receives a feedback signal and that is coupled to the loop filter, wherein at least one of the loop filter and the adder receives an input signal; and
   an output stage having:
      a comparator that is coupled to at least one of the loop filter and the adder; and
      a switching power stage that is coupled to the comparator.

3. The audio amplifier of claim 2, wherein the audio amplifier further comprises a feedback filter that is coupled between the switching power stage and the adder so as to provide the feedback signal to the amplifier.

4. The audio amplifier of claim 3, wherein the adder further comprises a node that is coupled to the loop filter, the feedback filter, and the comparator.

5. The audio amplifier of claim 4, wherein the feedback filter further comprises:
   a first branch having a resistor; and
   a second branch that is coupled substantially in parallel to the first branch, wherein the second branch includes a high-pass filter and a capacitor coupled in series with one another.

6. An audio amplifier comprising:
   a loop filter having a transfer function with a real part being minimized at and above a switching frequency of the audio amplifier, wherein the loop filter has a dominant pole placed substantially at or above an upper frequency in a range of input frequencies processed by the audio amplifier, and wherein the loop filter includes:
      a first resistor;
      a first leg having a second resistor and a first capacitor coupled in series with one another;
      a third resistor; and
      a second leg having a second capacitor, wherein the first resistor, the first leg, the third resistor, and the second leg are coupled in series with one another;
   an adder that receives a feedback signal and that is coupled to the loop filter, wherein at least one of the loop filter and the adder receives an input signal; and
   an output stage that is coupled to the adder.

7. The audio amplifier of claim 6, wherein the first resistor is coupled to the first leg, and wherein the first leg is coupled to the third resistor, and wherein the third resistor is coupled to the second leg.

8. The audio amplifier of claim 6, wherein the first resistor is coupled to the second leg, and wherein the first leg is coupled to the third resistor, and wherein the third resistor is coupled to the first leg.

9. The audio amplifier of claim 6, wherein the loop filter further comprises a fourth resist that is coupled in series with the first resistor, the first leg, the third resistor, and the second leg.

10. The audio amplifier of claim 9, wherein the first resistor is coupled to the first leg, and, wherein the first leg is coupled to the third resistor, and wherein the third resistor is coupled to the second leg, and wherein the second leg is coupled to the fourth resistor.

11. The audio amplifier of claim 9, wherein the first resistor is coupled to the second leg, wherein the first leg is coupled to the third resistor, and wherein the third resistor is coupled to the first leg, and wherein the first leg is coupled to the fourth resistor.

* * * * *